United States Patent [19]

Dalrymple

[11] Patent Number: 4,617,476
[45] Date of Patent: Oct. 14, 1986

[54] HIGH SPEED CLOCKED, LATCHED, AND BOOTSTRAPPED BUFFER

[75] Inventor: Monte J. Dalrymple, Fremont, Calif.

[73] Assignee: Zilog, Inc., Campbell, Calif.

[21] Appl. No.: 661,345

[22] Filed: Oct. 16, 1984

[51] Int. Cl.[4] .................. H03K 19/096; H03K 19/017
[52] U.S. Cl. ..................................... 307/443; 307/453; 307/481; 307/482; 307/578; 307/269; 307/279; 307/601; 307/605
[58] Field of Search ............ 307/200 B, 443, 448–449, 307/453, 475, 481–482, 577–578, 583–584, 269, 272 R, 279, 291, 594, 601, 605

[56] References Cited

U.S. PATENT DOCUMENTS

| 3,732,442 | 5/1973 | Husbands et al. | 307/200 B X |
|---|---|---|---|
| 4,063,117 | 12/1977 | Laugesen et al. | 307/482 X |
| 4,381,460 | 4/1983 | Menachem | 307/449 |
| 4,449,066 | 5/1984 | Aoyama et al. | 307/443 X |
| 4,463,273 | 7/1984 | Dingwall | 307/452 X |
| 4,472,644 | 9/1984 | Kirsch | 307/601 X |
| 4,490,633 | 12/1984 | Nouter et al. | 307/443 X |
| 4,542,307 | 9/1985 | Baba | 307/269 X |
| 4,549,101 | 10/1985 | Sood | 307/443 |

OTHER PUBLICATIONS

Mead and Conway, *Introduction to VLSI Design*, Addison-Wesley Pub. Co., Reading, Mass., Oct. 1980, p. 165.

Primary Examiner—Stanley D. Miller
Assistant Examiner—D. R. Hudspeth
Attorney, Agent, or Firm—Majestic, Gallagher, Parsons & Siebert

[57] ABSTRACT

From an input signal, a buffer circuit derives an output signal which changes in logic state in synchronism with the rising edges of a first clock and whose value follows the input signal but in opposite logic state. The first clock directly drives the buffer output through a first transistor whose gate is controlled by the output of a NOR-gate. The buffer output is connected to ground through two FET's whose gates are controlled respectively by the first clock and the input signal as sampled by a second clock. The buffer output after being delayed and the input signal as sampled by the second clock are applied to the inputs of the NOR-gate. By adding an FET between the gate of the first transistor and the output of the NOR-gate the bootstrap action caused by the gate-drain parasitic capacitance of the first transistor reduces the delay between the rise of the buffer output and the rising edge of the first clock. A holding circuit may be used to hold the value of the buffer output despite changes in the states of the clocks.

5 Claims, 3 Drawing Figures

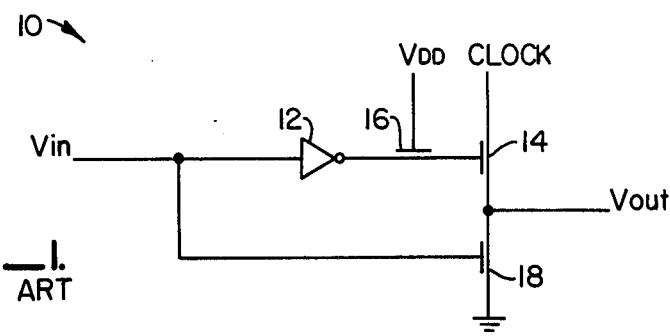
FIG._1.
PRIOR ART
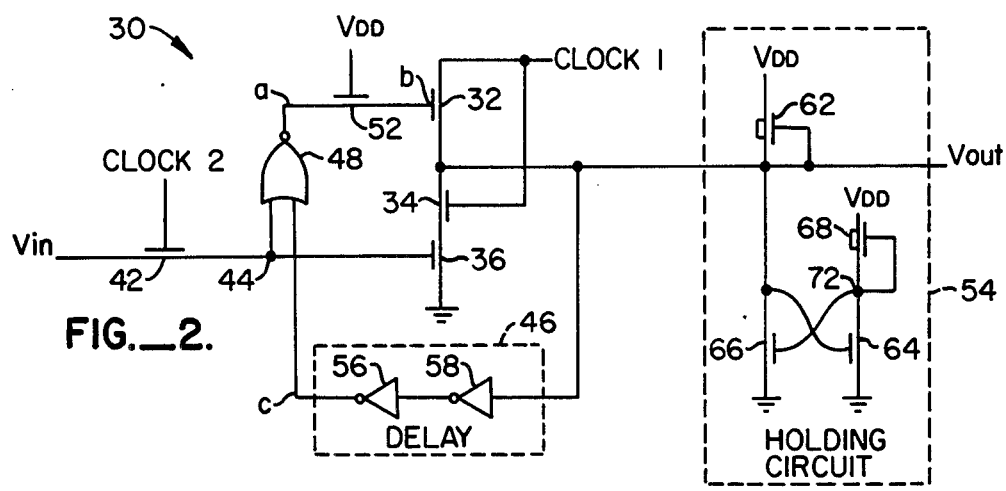
FIG._2.
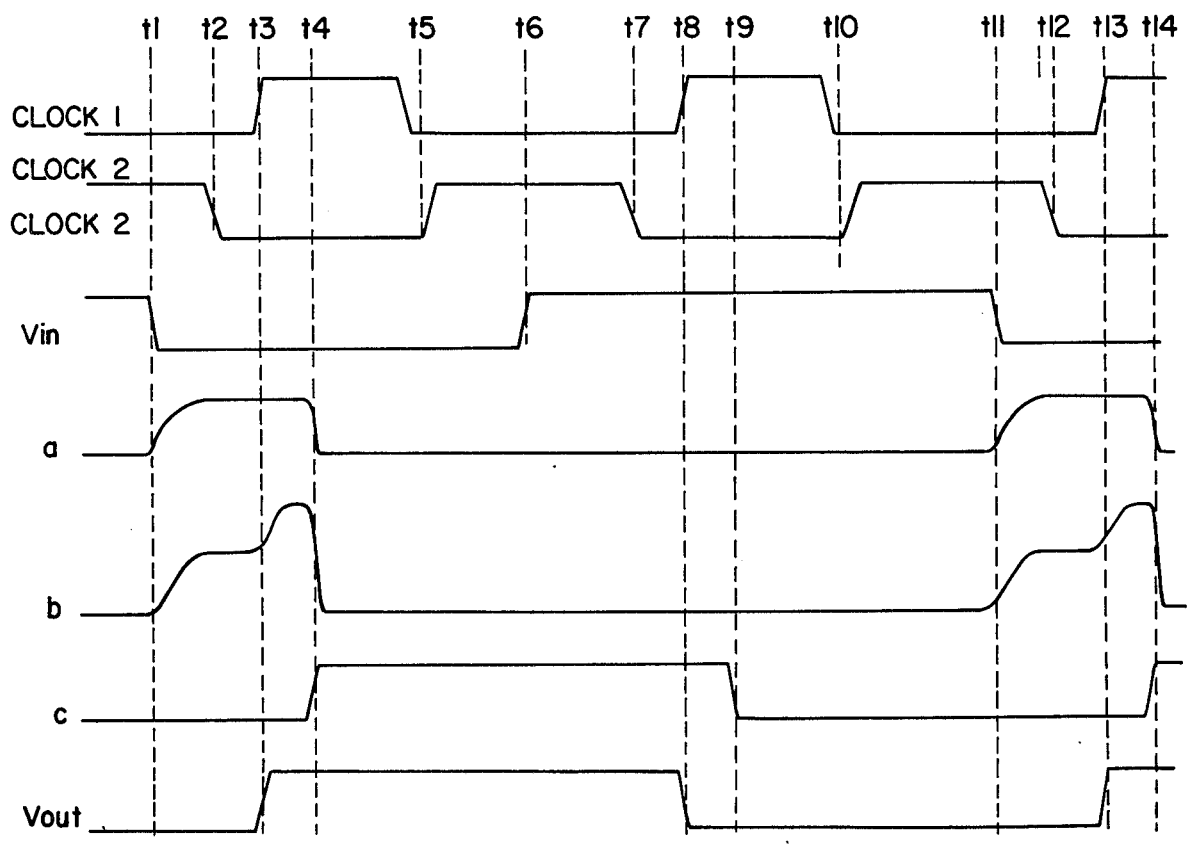
FIG._3.

HIGH SPEED CLOCKED, LATCHED, AND BOOTSTRAPPED BUFFER

BACKGROUND OF THE INVENTION

This application relates in general to buffer circuits and more particularly to high speed low power buffer circuits useful, for example, in integrated circuit logic devices.

As the technology for producing large scale integrated deviced advances, an increasing number of devices are now fabricated on a single integrated circuit chip. To be economical and useful, large scale logic circuits must operate at relatively high speed. High speed operation usually, however, implies relatively high power consumption. It is therefore desirable to provide a buffer circuit used in integrated circuits which is capable of fast response and high speed operation and yet consumes a low amount of power.

One type of conventional buffer circuit is illustrated in the schematic diagram of FIG. 1. The conventional buffer circuit 10 comprises an inverter 12 to which the input signal Vin is applied. The output of the inverter is connected to the gate of FET 14 through the main current path of FET 16. A constant DC voltage VDD is applied to the gate of FET 16. The main current path of FET 14 connects a clock and the output of the buffer circuit. The output of the buffer circuit is also connected to ground through the main current path of an FET 18. The input voltage Vin is applied to the gate of FET 18. When Vin is high it turns on FET 18 causing the output Vout to be pulled low. When the input voltage Vin is low, FET 18 is turned off and the output of inverter 12 is high. Since FET 16 is turned on at all times by DC voltage VDD this causes the gate of FET 14 to also go high. If the clock goes high when Vin is low the gate-drain parasitic capacitance of FET 14 forces the gate voltage of FET 14 to exceed VDD. FET 16 is thereby turned off allowing the gate voltage of FET 14 to be forced even higher in a process known as bootstrapping. This causes FET 14 to be turned on even harder which reduces the delay between Vout and the clock. If the clock goes low when Vin is low, output Vout is pulled low. Thus, the output Vout follows the clock when Vin is low.

In certain integrated circuit logic applications it may be desirable to provide a buffer circuit whose output does not follow the clock exactly as in the above described conventional buffer circuit. Instead, longer duration output pulses may be desirable. For example, instead of following the clock exactly, it may be desirable for the output to change logic state at a lower frequency than the clock frequency but where the changes are synchronized with the clock. It may also be desirable for a change in the logic state of the input signal to cause a corresponding change in the output state.

SUMMARY OF THE INVENTION

The buffer circuit of this invention derives, from an input signal, an outut signal which is substantially synchronous with at least some of the changes in state of a first clock signal and where a change in the state of the imput signal causes a corresponding change in the state of the output signal. The buffer circuit comprises a first transistor whose main current path is connected between the first clock and the circuit output so that the first clock drives the output directly. A second and a third transistor have their main current paths connected in series between the circuit output and ground for pulling the output low. The first clock is applied to the gate of the second transistor. A fourth transistor has its main current path connected between the input and the gate of the third transistor. A second clock applies a second clock signal to the gate of the fourth transistor so that the input signal is sampled within the time window determined by the second clock signal and so that the sampled input signal is applied to the gate of the fourth transistor. The buffer output is delayed by a delay means and the delayed output is applied to one of the inputs of a NOR-gate. The other input of the NOR-gate receives the sampled input signal through the main current path of the fourth transistor. A DC voltage is applied to the gate of a fifth transistor whose main current path is connected between the output of the NOR-gate and the gate of the first transistor for boosting the voltage at the gate of the first transistor so that the delay between the rise times of the first clock and changes in the state of the buffer output is reduced. The output signal is delayed by the delay means by such time before it is applied to the NOR-gate that the output signal is allowed to rise to substantially its maximum value before such rise causes the first transistor to be turned off. A holding means holds the value of the output when the first transistor is turned off and when the second or third transistors is turned off.

BRIEF DESCRIPTION OF THE DRAWINGS

FIG. 1 is a schematic circuit diagram illustrating a conventional buffer circuit.

FIG. 2 is a schematic circuit diagram of a buffer circuit illustrating the preferred embodiment of this invention.

FIG. 3 is a timing diagram for the circuit of FIG. 2 to illustrate the preferred embodiment.

DETAILED DESCRIPTION OF THE PREFERRED EMBODIMENT

FIG. 2 is a schematic circuit diagram of a high speed clocked buffer circuit 30 illustrating the preferred embodiment of this invention. Vout goes high after Vin falls low and Vout falls low after Vin goes high. Thus a change in state of the input Vin causes a corresponding change in the output Vout of the buffer circuit 30. The change in Vout, however, does not immediately follow the change in state of Vin. Instead, Vout changes only upon the rising edge of clock 1. Thus, a change in state of Vin causes a corresponding change in the state of Vout, where Vout is synchronous with the rising edge of clock 1.

As shown in FIG. 2 the buffer output is driven by clock 1 through the main current path of a FET 32. The buffer output is connected to ground through the main current paths of two FETs 34, 36 connected in series. The gate of FET 34 is also driven by clock 1. The input Vin is sampled by clock 2 through the main current path of FET 42, with clock 2 applied to the gate of FET 42. Thus, when clock 2 is high, node 44 and the gate of FET 36 take on the value of Vin. When clock 2 goes low the value of node 44 and the gate of FET 36 remain unchanged despite changes in the state of the input Vin. The buffer output is connected through a delay 46 to node c. Nodes 44 and c are connected to the inputs of a NOR-gate 48 whose output is connected to node a. Node a is then connected to node b which is at the gate of FET 32 through the main current path of an FET 52. A DC voltage VDD is applied to the gate of FET 52. A holding circuit 54 holds the value of the buffer output when FET 32 is turned off and when either one or both of FET's 34 and 36 are turned off.

FIG. 3 is a timing diagram showing the state of the different components in the buffer circuit of FIG. 2 to illustrate the preferred embodiment. The operation of buffer circuit 30 will now be illustrated in reference to FIG. 3. The state of the circuit is first described at a time preceding time t1. Before time t1 the input Vin is high. The output Vout is low and nodes a, b and c are all low. Clocks 1 and 2 are non-overlapping clocks. Before time t1 clock 1 is low and clock 2 is high. When clock 2 is high node 44 follows Vin to high. NOR-gate 48 causes node a to be low. Since a DC voltage VDD is applied to the gate of FET 52, FET 52 is turned on and node b follows node a to low. FET 32 is thereby turned off before time t1. Clock 1 is low so that FET 34 is turned off and the buffer output Vout is maintained low by holding circuit 54 in a manner desribed below.

At time t1 the input Vin falls low. Since clock 2 is still high it samples the input Vin through FET 42 and passes the input value to node 44 and the gate of FET 36. Thus, node 44 goes low. Since both nodes c and 44 are low, NOR-gate 48 causes nodes a and b to rise. At time t2 clock 2 goes low thereby locking in the value of node 44 and the gate of 36 despite subsequent changes of the input state. At time t3 clock 1 goes high. Since node b has gone high FET 32 has been turned on so that clock 1 drives the buffer output Vout high. Bootstrapping action due to the gate-drain capacitance of FET 32 will drive node b to a high voltage in the same manner as in the prior art buffer of FIG. 1. Such bootstrap action reduces the delay in the rise of the buffer output Vout in following the rise of clock 1. Thus, as shown in FIG. 3 there is little delay between the rise of Vout and the rise of clock 1. The buffer output is connected through a delay 46 to node c. At time t4 node c rises to follow the buffer output. This causes the output of NOR-gate 48 to go low. Node b follows node a to go low, thereby turning off FET 32. The output Vout is held low by the holding circuit 54. The delay introduced by delay 46 allows time for the output Vout to rise to substantially its full value before turning off FET 32.

At time t5 clock 1 falls low and clock 2 rises. The gate of FET 36 remains low (since Vin is low) and FET 34 is turned off. Therefore the value of the buffer output remains unchanged at t5 and is not pulled low. Since clock 2 has risen it again samples the input causing node 44 and the gate of 36 to go low. At time t6 the input Vin again rises causing node 44 and the gate of FET 36 to go high.

At time t7 clock 2 again goes low thereby isolating noe 44 and FET 36 from the buffer input and thereby maintaining the gate of FET 36 at a high state. FET 36 is turned on. At time t8 clock 1 goes high which turns on FET 34. Since FET 36 has already been turned on, Vout is immediately pulled low. At time t9 node c follows Vout by a delay caused by delay circuit 46 and goes low. It will be noted that at this time Vin, Vout and nodes a, b and c have all returned to their original states before time t1. The change in states in clocks 1 and 2 at time t10 does not affect nodes a, b and c and Vout and the entire circuit is then ready for the next cycle which begins at time t11. It will be noted that the operation of buffer circuit 30 at times t11-t14 is identical to that at times t1-t4.

From the above description it will be noted that if Vin goes low, Vout will go high during the next time clock 1 goes high. When Vin falls from high to low, Vout will be caused to go from low to high at the next instant when clock 1 again rises from low to high. In other words, Vout follows Vin in opposite state at times sychronized with the rising edges of clock 1. If the input Vin remains unchanged Vout will also remain unchanged despite the changes in the states of clocks 1 and 2. This for example is illustrated at time t5 and t10. If Vin does not go high at time t6 but remains low until after time t8, when clock 1 rises at time t8, FET 34 is turned on but FET 36 is still off. In such case Vout will not be pulled low at the rising edge of clock 1. Similarly, if Vin remains high from t1 until after t3, the rising edge of clock 1 will not cause Vout to go from low to high at time t3. The levels of Vout are maintained by holding circuit 54 despite changes in the states of clocks 1 and 2 as described below.

Delay 46 may comprise two inverters 56 and 58 connected in series. Holding circuit 54 may be a latch comprising four FET's 62, 64, 66 and 68. The main current path of depletion type FET 62 is connected between a DC voltage VDD and buffer output Vout. The gate of FET 62 is also connected to the buffer output. Thus, even though clock 1 has fallen low at time t5, FET 62 and DC voltage VDD maintain the buffer output high.

Buffer output Vout is connected to the gate of FET 64 whose main current path is connected between node 72 and ground. Vout is also connected to ground through the main current path of FET 66 whose gate is connected to node 72. Depletion type FET 68 has its main current path connected between a DC voltage VDD and node 72. The gate of FET 68 is also connected to node 72. At time t3 Vout follows clock 1 to go high. When the buffer output is high, FET 64 is turned on which therefore pulls node 72 low, despite its connection to VDD and depletion type FET 68. This in turn turns off FET 66 which therefore isolates the buffer output from ground and prevents Vout from being pulled low. At time t5 clock 1 goes low but Vout is held high by FET 62 and VDD as described above. At time t8 as discussed above Vout is pulled low through FET's 34, 36 despite latch 54. This causes FET 64 to be turned off. Node 72 therefore is charged high through FET 68 by VDD. This in turn turns on FET 66 which keeps Vout low despite the change in state of clock 1 at time t10. It will be understood that delay and holding circuits other than those described above may be used and are within the scope of the invention.

From the above it will be seen that the objectives of this invention has been achieved. Vout follows the rising edge of clock 1 with little delay. The holding circuit consumes little power since no power is consumed by the holding circuit except when the buffer output Vout changes state. By employing clock 1 and 2 which do not overlap, the bootstrapping action at FET 32 will not be disturbed by the change in state of the input Vin. Delay 46 delays the turning off of FET 32 to prevent the premature turning off of FET before the buffer output Vout rises to its maximum level. The bootstrapping action at FET 32 allows clock 1 to drive Vout without additional power sources.

The above-description of circuit implementation and method is merely illustrative thereof and various changes and arrangements or circuit components or other details of the method and implementation may be within the scope of the appended claims.

I claim:

1. A buffer circuit for deriving, from an input signal, an output signal which is substantially synchronous with at least some of the changes in state of a first clock signal and wherein a change in logic state of the input signal causes a corresponding change in logic state of the output signal, said buffer circuit comprising:
   a first transistor whose main current path is connected between the first clock and the circuit output, so that the first clock drives the output directly;
   a second and a third transistor whose main current paths are connected in series between the circuit output and ground for pulling the output low, the first clock signal being applied to the gate of the second transistor;
   a fourth transistor whose main current path is connected between the input and the gate of the third transistor;
   a second clock for applying a second clock signal to the gate of the fourth transistor, so that the input signal is sampled within a time window determined by the second clock signal, and so that the sampled input signal is applied to the gate of the fourth transistor;
   a delay means for delaying the output signal;
   a NOR-gate receiving at its inputs the sampled input signal and the delayed output signal;
   a fifth transistor whose gate is supplied with a first DC voltage and whose main current path is connected between the output of the NOR-gate and the gate of the first transistor for boosting the voltage at the gate of the first transistor so that the delay between the rise times of the first clock and changes in the state of the output signals is reduced, and wherein the delayed output signal is delayed by the delay means by such time that the output signal is allowed to rise to substantially its maximum value before such rise causes the first transistor to be turned off; and
   means coupled to the circuit output for holding the value of the output signal when the first transistor is turned off and when the second or third transistors is turned off.

2. The buffer circuit of claim 1, wherein the first, second, third, fourth and fifth transistors are FET's.

3. The buffer circuit of claim 1, wherein the delay means comprises two inverters connected in series.

4. The buffer circuit of claim 1, wherein the holding means includes a latch means.

5. The buffer circuit of claim 4, wherein said latch means comprises:
   a sixth transistor whose main current path is connected between the circuit output and ground and whose gate is connected to a node;
   a seventh transistor whose main current path is connected between the node and ground and whose gate is connected to the circuit output;
   a first depletion type FET whose main current path is connected between the node and a second DC voltage and whose gate is connected to the node; and
   a second depletion type FET whose main current path is connected between the second DC voltage and the circuit output and whose gate is connected to the circuit output.

* * * * *